US011972955B2

(12) United States Patent
Matsui

(10) Patent No.: US 11,972,955 B2
(45) Date of Patent: Apr. 30, 2024

(54) DRY ETCHING METHOD, METHOD FOR MANUFACTURING SEMICONDUCTOR ELEMENT, AND CLEANING METHOD

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 104 days.

(21) Appl. No.: 17/612,774

(22) PCT Filed: Apr. 30, 2021

(86) PCT No.: PCT/JP2021/017287
§ 371 (c)(1),
(2) Date: Nov. 19, 2021

(87) PCT Pub. No.: WO2021/241143
PCT Pub. Date: Dec. 2, 2021

(65) Prior Publication Data
US 2023/0154763 A1 May 18, 2023

(30) Foreign Application Priority Data

May 29, 2020 (JP) ................................ 2020-094360

(51) Int. Cl.
*H01L 21/3213* (2006.01)
*B08B 9/08* (2006.01)
(Continued)

(52) U.S. Cl.
CPC .......... *H01L 21/32136* (2013.01); *B08B 9/08* (2013.01); *C09K 13/00* (2013.01);
(Continued)

(58) Field of Classification Search
None
See application file for complete search history.

(56) References Cited

U.S. PATENT DOCUMENTS 5,362,350 A * 11/1994 Yanagida .......... H01L 21/32136
216/48
6,261,955 B1 * 7/2001 Aliyu ................ H01L 21/02079
438/906

(Continued)

FOREIGN PATENT DOCUMENTS

EP    0 946 407 A1   10/1999
JP       3381076 B2    2/2003
(Continued)

OTHER PUBLICATIONS

International Search Report dated Jul. 27, 2021, issued by the International Searching Authority in application No. PCT/JP2021/017287.

*Primary Examiner* — Jiong-Ping Lu
(74) *Attorney, Agent, or Firm* — Sughrue Mion, PLLC

(57) ABSTRACT

A dry etching method which includes a dry etching step in which an etching gas containing a halogen fluoride being a compound of bromine or iodine and fluorine is brought into contact with a member to be etched (12) including an etching target being a target of etching with the etching gas to etch the etching target without using plasma. The etching target contains copper. Additionally, the dry etching step is performed under temperature conditions of from 140° C. to 300° C. Also disclosed is a method for manufacturing a semiconductor element and a cleaning method using the dry etching method.

14 Claims, 1 Drawing Sheet

(51) Int. Cl.
    *C09K 13/00*     (2006.01)
    *C23F 1/10*     (2006.01)
    *C23F 1/12*     (2006.01)
    *H01L 21/302*     (2006.01)

(52) U.S. Cl.
    CPC ............... *C23F 1/10* (2013.01); *C23F 1/12* (2013.01); *H01L 21/302* (2013.01); *H01L 21/32135* (2013.01); *B08B 2209/08* (2013.01)

(56) References Cited

U.S. PATENT DOCUMENTS

| | | | | |
|---|---|---|---|---|
| 6,368,518 | B1 * | 4/2002 | Vaartstra | C23F 4/00 |
| | | | | 216/75 |
| 2009/0042397 | A1 | 2/2009 | Miyoshi | |
| 2016/0005612 | A1 | 1/2016 | Kikuchi et al. | |
| 2018/0166255 | A1 * | 6/2018 | Blomberg | C09K 13/08 |
| 2019/0355590 | A1 | 11/2019 | Suzuki et al. | |

FOREIGN PATENT DOCUMENTS

| | | |
|---|---|---|
| JP | 2009-43976 A | 2/2009 |
| JP | 2018-166205 A | 10/2018 |
| WO | 98/27005 A1 | 6/1998 |

\* cited by examiner

DRY ETCHING METHOD, METHOD FOR MANUFACTURING SEMICONDUCTOR ELEMENT, AND CLEANING METHOD

CROSS REFERENCE TO RELATED APPLICATIONS

This application is a National Stage of International Application No. PCT/JP2021/017287, filed Apr. 30, 2021, claiming priority to Japanese Patent Application No. 2020-094360, filed May 29, 2020.

TECHNICAL FIELD

The present invention relates to a dry etching method, a method for manufacturing a semiconductor element, and a cleaning method.

BACKGROUND ART

Copper (Cu) is widely used as a wiring material for semiconductor elements because of low electrical resistance in addition to high electromigration resistance. However, many of reaction products between copper and etching gas have little vapor pressure, so that dry etching of copper is not easy.

CITATION LIST

Patent Literature
PTL 1: JP 3381076 B

SUMMARY OF INVENTION

Technical Problem

For example, PTL 1 proposes a method for plasma etching copper using iodine halide as the etching gas. However, in the technology disclosed in PTL 1, etching using plasma is needed, which is a problem in terms of requiring an expensive plasma generation device.

It is an object of the present invention to provide a dry etching method capable of etching an etching target containing copper without using plasma, a method for manufacturing a semiconductor element, and a cleaning method.

Solution to Problem

In order to achieve the above object, an aspect of the present invention is as follows: [1] to [15].

[1] A dry etching method including a dry etching step in which an etching gas containing a halogen fluoride being a compound of bromine or iodine and fluorine is brought into contact with a member to be etched including an etching target being a target of etching with the etching gas to etch the etching target without using plasma, the etching target containing copper, and the dry etching step being performed under temperature conditions of from 140° C. to 300° C.

[2] The dry etching method according to [1], in which the etching gas is a gas comprising only a gas of the halogen fluoride or is a mixed gas containing the halogen fluoride and inert gas.

[3] The dry etching method according to [2], in which the inert gas is at least one selected from nitrogen gas, helium, argon, neon, krypton, and xenon.

[4] The dry etching method according to any one of [1] to [3], in which an amount of the halogen fluoride contained in the etching gas is from 1% by volume to 90% by volume.

[5] The dry etching method according to any one of [1] to [4], in which the halogen fluoride is at least one of bromine pentafluoride or iodine heptafluoride.

[6] The dry etching method according to any one of [1] to [5], in which an amount of oxygen gas contained in the etching gas is 1% by volume or less.

[7] The dry etching method according to any one of [1] to [6], in which the dry etching step is performed under pressure conditions of from 50 Pa to 80 kPa.

[8] The dry etching method according to any one of [1] to [7], in which the etching target contains at least one of a copper compound containing at least one type of atom among oxygen, nitrogen, and halogen atoms and copper or elemental copper.

[9] The dry etching method according to any one of [1] to [8], in which the dry etching step is performed under temperature conditions of from 210° C. to 280° C.

[10] The dry etching method according to any one of [1] to [9], in which the member to be etched includes a non-etching target not being the target of the etching with the etching gas and the etching target, the etching target being selectively etched compared to the non-etching target.

[11] The dry etching method according to [10], in which the non-etching target is at least one selected from silicon oxide, photoresist, and amorphous carbon.

[12] The dry etching method according to or [11], in which an etching selectivity ratio being a ratio of an etching rate of the etching target to an etching rate of the non-etching target is 5 or more.

[13] A method for manufacturing a semiconductor element, the method using the dry etching method according to any one of [1] to [12] to manufacture the semiconductor element, in which the member to be etched is a semiconductor substrate including the etching target, and which manufacturing method includes a processing step of removing at least a part of the etching target from the semiconductor substrate by the dry etching method.

[14] The method for manufacturing a semiconductor element according to [13], in which copper wiring is formed on the semiconductor substrate by the processing step.

[15] A cleaning method for cleaning an inner surface of a chamber of a semiconductor element manufacturing device using the dry etching method according to any one of [1] to [12], in which the member to be etched is the chamber, the chamber having, on the inner surface, a deposit adhered due to operation of the semiconductor element manufacturing device, and the deposit being the etching target, and which cleaning method includes a cleaning step of removing the deposit from the inner surface of the chamber by the dry etching method.

Advantageous Effects of Invention

According to the present invention, an etching target containing copper can be etched without using plasma.

BRIEF DESCRIPTION OF DRAWINGS

FIG. 2 is a diagram illustrating a test piece used in Example 1 and the like.

DESCRIPTION OF EMBODIMENTS

Figure 1:
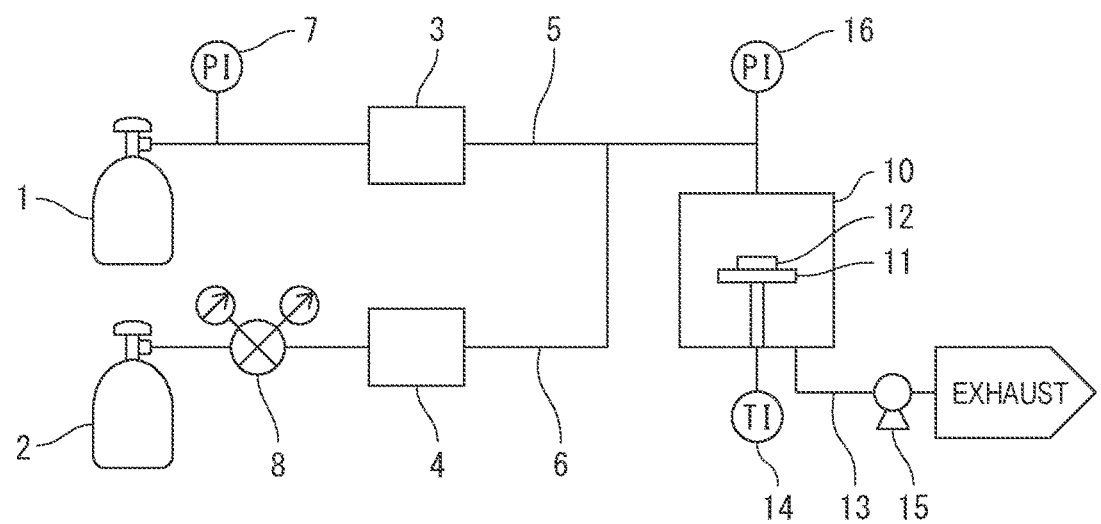
FIG. 1 is a schematic diagram of an example of an etching device illustrating an embodiment of a dry etching method according to the present invention.

An embodiment of the present invention will be described below. It should be noted that the present embodiment is illustrative of an example of the present invention, and the present invention is not limited thereto. Additionally, various changes or improvements can be added to the present embodiment, and embodiments added with such changes or improvements may also be included in the present invention.

A dry etching method according to the present embodiment includes a dry etching step in which an etching gas containing a halogen fluoride being a compound of bromine (Br) or iodine (I) and fluorine (F) is brought into contact with a member to be etched including an etching target being a target of etching with the etching gas to etch the etching target without using plasma. The etching target contains copper (Cu). Additionally, in the dry etching method according to the present embodiment, the dry etching step is performed under temperature conditions of from 140° C. to 300° C. Hereinafter, the etching method not using plasma may also be referred to as "plasmaless etching".

When the etching gas is brought into contact with the member to be etched, the halogen fluoride in the etching gas reacts with the copper in the etching target to generate copper fluoride. Copper fluoride is volatile, so that the generated copper fluoride volatilizes, causing etching of the etching target to proceed.

Therefore, the dry etching method according to the present embodiment allows the etching target containing copper to be etched selectively and at a sufficient etching rate without using plasma. In other words, the etching target can be selectively etched compared to a non-etching target that is not the target of the etching with the etching gas. The non-etching target will be described in detail later.

Additionally, since the dry etching method according to the present embodiment allows for etching of the etching target without using plasma, it is unnecessary to etch using an expensive plasma generation device. Thus, etching of the member to be etched can be performed at low cost. In addition, since plasma is not used, it is less likely to cause corrosion in a member forming the etching device (for example, a chamber), a pipe connected to the etching device, a member forming a semiconductor element manufacturing device described later (for example, a chamber), a pipe connected to the semiconductor element manufacturing device described later, and the like.

It should be noted that the etching meant in embodiments of the present invention includes processing the member to be etched into a predetermined shape (for example, a three-dimensional shape) by removing a part or all of the etching target included in the member to be etched (for example, processing the etching target in film form comprising copper into a predetermined film thickness) and cleaning or etching back the member to be etched by removing a residue or deposit comprising the etching target from the member to be etched.

The dry etching method according to the present embodiment can be used to manufacture semiconductor elements and clean the inner surfaces of chambers of semiconductor element manufacturing devices.

In other words, a method for manufacturing a semiconductor element according to the present embodiment is a method for manufacturing a semiconductor element, which uses the dry etching method according to the present embodiment to manufacture the semiconductor element, in which the member to be etched is a semiconductor substrate including the etching target, and which manufacturing method includes a processing step of removing at least a part of the etching target from the semiconductor substrate by the dry etching method according to the above-described present embodiment.

For example, the dry etching method according to the present embodiment can be used to form copper wiring on a semiconductor substrate of a semiconductor element or etch back for removal of an excessive copper film. Conventionally, copper wirings have often been formed by a wet process using a chemical mechanical polishing (CMP) slurry or a wet etching solution. However, dry etching with etching gas is superior to wet processes in terms of micro-machinability. Therefore, the dry etching method according to the present embodiment can be expected to contribute to further miniaturization and higher integration of semiconductor elements.

Additionally, in manufacturing a semiconductor element using the dry etching method according to the present embodiment, when the non-etching target itself described later is used as a structural body of the semiconductor element or a resist, a material that does not substantially react with halogen fluoride or a material that is extremely late to react with halogen fluoride is used as the non-etching target. Specific examples of such a non-etching target usable herein include at least one selected from silicon oxide (for example, silicon dioxide ($SiO_2$)), photoresist, and amorphous carbon.

Furthermore, the dry etching method according to the present embodiment can also be used for cleaning, as described above. Specifically, a cleaning method according to the present embodiment is a cleaning method for cleaning an inner surface of a chamber of a semiconductor element manufacturing device using the dry etching method according to the present embodiment, in which the member to be etched is the chamber. The chamber has a deposit, on the inner surface, adhered due to operation of the semiconductor element manufacturing device, and the deposit is the etching target. Additionally, the cleaning method according to the present embodiment includes a cleaning step of removing the deposit from the inner surface of the chamber by the dry etching method according to the above-described present embodiment.

For example, after performing a step of forming a film comprising the etching target containing copper on the semiconductor substrate and a step of etching the film comprising the etching target containing copper and formed on the semiconductor substrate in a chamber whose inner surface is made of a material not containing copper, cleaning can be performed by removing a deposit containing copper adhered onto the inner surface of the chamber using the dry etching method according to the present embodiment.

Hereinafter, a more detailed description will be given of the dry etching method, the method for manufacturing a semiconductor element, and the cleaning method according to the present embodiment.

[Halogen Fluoride]

The type of the halogen fluoride is not particularly limited as long as it is a compound of bromine or iodine and fluorine. Preferred is at least one selected from bromine monofluoride (BrF), bromine trifluoride ($BrF_3$), bromine pentafluoride ($BrF_5$), iodine monofluoride (IF), iodine trifluoride ($IF_3$), iodine pentafluoride ($IF_5$), and iodine heptafluoride ($IF_7$). Among these halogen fluorides, more preferred is at least one selected from bromine trifluoride, bromine pentafluoride, iodine pentafluoride, and iodine heptafluoride, and still more preferred is at least one selected from bromine pentafluoride and iodine heptafluoride, in terms of stability and ease of vaporization.

[Etching Gas]

The etching gas is a halogen fluoride containing gas. The etching gas may be a gas comprising only halogen fluoride or a mixed gas containing halogen fluoride and another type of gas. When the etching gas is a mixed gas containing halogen fluoride and another type of gas, the amount of the halogen fluoride contained in the etching gas is preferably 1% by volume or more, more preferably 5% by volume or more, and still more preferably 10% by volume or more, in order to etch the etching target at a sufficient etching rate. In addition, in terms of etching stability and ease of exhaust gas processing, the amount of the halogen fluoride contained in the etching gas is preferably 90% by volume or less, more preferably 60% by volume or less, and still more preferably 40% by volume or less.

When the etching gas is a mixed gas containing halogen fluoride and another type of gas, inert gas is preferably used as the other type of gas. In other words, the etching gas may be a mixed gas containing halogen fluoride and inert gas. As the inert gas, at least one selected from nitrogen gas ($N_2$), helium (He), argon (Ar), neon (Ne), krypton (Kr), and xenon (Xe) can be used. The amount of the insert gas contained in the etching gas is not particularly limited, but may be more than 0% by volume and 99% by volume or less, and more preferably from 60% by volume to 97% by volume in terms of ease of handling of the etching gas.

The amount of oxygen gas ($O_2$) contained in the etching gas is preferably 1% by volume or less, more preferably less than 1000 ppm by volume, and still more preferably less than 300 ppm by volume. When the amount of the oxygen gas contained is 1% by volume or less, a copper oxide film is unlikely to be formed on a copper surface, so that the etching rate of copper is likely to be high. It is also unlikely that the diffusion of oxygen atoms inside from the copper oxide film causes problems such as the occurrence of an etching residue and increased wiring resistance.

[Pressure Conditions for Dry Etching Step]

Pressure conditions for the dry etching step in the dry etching method according to the present embodiment are not particularly limited as long as halogen fluoride can be present in a gaseous form at the temperature and pressure during etching, but are preferably from 50 Pa to 80 kPa, more preferably from 200 Pa to 70 kPa, and still more preferably from 500 Pa to 60 kPa.

For example, the member to be etched is placed in the chamber, and etching can be performed while distributing the etching gas in the chamber. The pressure in the chamber during the distribution of the etching gas can be from 10 Pa to 100 kPa. The flow rate of the etching gas may be appropriately set according to the size of the chamber and the capacity of an exhaust system for reducing the pressure in the chamber so that the pressure in the chamber is maintained constant.

[Temperature Conditions for Dry Etching Step]

Temperature conditions for the dry etching step in the dry etching method according to the present embodiment are needed to be from 140° C. to 300° C. Here, although the temperature of the temperature conditions refers to the temperature of the member to be etched, the temperature of the stage supporting the member to be etched placed in the chamber of the etching device can also be used.

When the temperature condition for the dry etching step is 140° C. or more, halogen fluoride can be present in the gaseous form, and the etching rate of copper is likely to be higher. Note that the temperature condition for the dry etching step is preferably 160° C. or more, and more preferably more than 200° C. Particularly, at 210° C. or more, the etching rate of a copper compound increases, facilitating a significant contribution to improvement of efficiency of the etching step.

On the other hand, when the temperature condition for the dry etching step is 300° C. or less, there are advantages such as that etching can be performed without requiring excessive time and energy, that load on the etching device and the semiconductor element manufacturing device is small, and that it is possible to suppress etching of a portion that should originally not be etched (for example, the non-etching target described later). Note that the temperature condition for the dry etching step is preferably 280° C. or less, and more preferably 260° C. or less.

Halogen fluoride hardly reacts with the non-etching target such as at least one of silicon oxide, photoresist, or amorphous carbon in the absence of plasma and under the temperature conditions of 300° C. or less. Therefore, when the member to be etched includes both the etching target and the non-etching target, using the dry etching method according to the present embodiment allows the etching target to be selectively etched without hardly etching the non-etching target. Thus, the dry etching method according to the present embodiment can be used for methods of processing an etching target into a predetermined shape by using a patterned non-etching target as a mask, and the like.

Furthermore, when temperatures of the etching target and the non-etching target are 300° C. or less, etching selectivity ratio is likely to be high. For example, the etching selectivity ratio, which is a ratio of an etching rate of the etching target to an etching rate of the non-etching target, is likely to be 5 or more. The etching selectivity ratio is more preferably 10 or more, and still more preferably 20 or more.

[Member to be Etched]

The member to be etched that is subjected to etching by the dry etching method according to the present embodiment includes an etching target being the target of etching with the etching gas, but may or may not include a non-etching target not being the target of the etching with the etching gas.

When the member to be etched includes the etching target and the non-etching target, the member to be etched may be a member that includes a portion formed by the etching target and a portion formed by the non-etching target or a member formed by a mixture of the etching target and the non-etching target. The member to be etched may also include a material other than the etching target and the non-etching target.

In addition, the shape of the member to be etched is not particularly limited, and, for example, may be in plate, foil, film, powder, or lump form. An example of the member to be etched is the above-mentioned semiconductor substrate.

[Etching Target]

The etching target to be etched with the etching gas contains copper, but may contain at least one of a copper compound containing at least one type of atom among oxygen, nitrogen, and halogen atoms and copper (for example, a copper oxide, a copper nitride, a copper oxynitride, or a copper halide) or elemental copper. More specifically, the etching target may be, for example, one comprising elemental copper, one comprising the copper compound, one comprising a mixture containing elemental copper, or one comprising a mixture containing the copper compound.

The etching target has a copper content of preferably 1% by mole or more, more preferably 10% by mole or more, and still more preferably 40% by mole or more. Additionally, the shape of the etching target and the shape of a portion of the etching target formed by only elemental copper are not particularly limited, and for example, may be in foil, film, powder, or lump form.

[Non-Etching Target]

As described above, the member to be etched may include a non-etching target not being the target of etching with the etching gas. The non-etching target is hardly etched by the etching method according to the present embodiment, so that the etching of the etching target with the etching gas can be suppressed by the non-etching target.

Thus, the etching method according to the present embodiment can be used for methods such as processing an etching target into a predetermined shape (for example, processing a film-formed etching target included in a member to be etched into a predetermined film thickness) by using a patterned non-etching target as a mask, and therefore can be suitably used to manufacture semiconductor elements.

Furthermore, since the non-etching target is hardly etched, etching of a portion that should originally not be etched in a semiconductor element can be suppressed by the non-etching target, which can prevent characteristics of the semiconductor element from being lost due to etching.

The non-etching target is a material that does not substantially react with halogen fluoride or a material that is extremely late to react with halogen fluoride, and for example, is at least one selected from silicon oxide, photoresist, and amorphous carbon.

Photoresist means a photosensitive composition whose physical properties such as solubility are changed by light, electron beams, or the like. Examples of the photoresist include photoresists for g-line, h-line, i-line, KrF, ArF, $F_2$, EUV, and the like. The composition of the photoresist is not particularly limited as long as it is commonly used in semiconductor element manufacturing processes. Examples of the composition thereof include compositions containing polymers synthesized from at least one monomer selected from chain olefins, cyclic olefins, styrene, vinylphenols, (meth)acrylic acids, (meth)acrylates, epoxies, melamines, and glycols. Note that (meth)acrylic acid means one or both of acrylic acid and methacrylic acid, and (meth)acrylate means one or both of acylate and methacrylate.

Next will be a description of a configuration example of an etching device capable of performing the dry etching method according to the present embodiment and an example of a copper dry etching method using the etching device with reference to FIG. 1. The etching device of FIG. 1 is a plasmaless etching device not using plasma. First will be a description of the etching device of FIG. 1.

The etching device of FIG. 1 includes a chamber 10 inside which etching is performed, a stage 11 that supports, in the chamber 10, a member to be etched 12 that is subjected to etching, a thermometer 14 that measures temperature of the member to be etched 12, an exhaust pipe 13 for exhausting a gas in the chamber 10, a vacuum pump 15 provided on the exhaust pipe 13 to reduce pressure in the chamber 10, and a pressure gauge 16 that measures the pressure in the chamber 10.

The etching device of FIG. 1 also includes an etching gas supply unit that supplies an etching gas into the chamber 10. The etching gas supply unit includes a halogen fluoride gas supply unit 1 that supplies halogen fluoride, an inert gas supply unit 2 that supplies inert gas, a halogen fluoride gas supply pipe 5 that connects the halogen fluoride gas supply unit 1 to the chamber 10, and an inert gas supply pipe 6 that connects the inert gas supply unit 2 to an intermediate portion of the halogen fluoride gas supply pipe 5.

Furthermore, the halogen fluoride gas supply pipe 5 is provided with a pressure gauge 7 that measures pressure of the halogen fluoride gas and a halogen fluoride gas flow rate control device 3 that controls flow rate of the halogen fluoride gas. Still furthermore, the inert gas supply pipe 6 is provided with an inert gas pressure control device 8 that controls pressure of the inert gas and an inert gas flow rate control device 4 that controls flow rate of the inert gas.

Then, when the halogen fluoride gas is supplied as the etching gas to the chamber 10, the halogen fluoride gas is supplied to the chamber 10 via the halogen fluoride gas supply pipe 5 by sending the halogen fluoride gas out from the halogen fluoride gas supply unit 1 to the halogen fluoride gas supply pipe 5.

Additionally, when the mixed gas of the halogen fluoride gas and the inert gas is supplied as the etching gas, the halogen fluoride gas is sent out from the halogen fluoride gas supply unit 1 to the halogen fluoride gas supply pipe 5, and also the inert gas is sent out from the inert gas supply unit 2 to the halogen fluoride gas supply pipe 5 via the inert gas supply pipe 6. As a result, the halogen fluoride gas and the inert gas are mixed together at the intermediate point of the halogen fluoride gas supply pipe 5 to form a mixed gas, and the mixed gas is supplied to the chamber 10 via the halogen fluoride gas supply pipe 5.

Note that configurations of the halogen fluorine gas supply unit 1 and the inert gas supply unit 2 are not particularly limited, and, for example, they may be tanks, cylinders, or the like. In addition, examples of the halogen fluoride gas flow rate control device 3 and the inert gas flow rate control device 4 usable herein include mass flow controllers and flow meters.

When supplying the etching gas to the chamber 10, it is preferable to supply the etching gas while maintaining supply pressure of the etching gas (i.e., a value of the pressure gauge 7 in FIG. 1) at a predetermined value. Specifically, the supply pressure of the etching gas is preferably from 1 kPa to 1.0 MPa, more preferably from 10 kPa to 0.5 MPa, and still more preferably from 30 kPa to 0.3 MPa. When the supply pressure of the etching gas is within the above range, the etching gas is smoothly supplied to the chamber 10, and load on components (for example, the various devices and the pipes) included in the etching device of FIG. 1 is small.

Additionally, the pressure of the etching gas supplied into the chamber 10 is preferably from 50 Pa to 80 kPa, and more preferably from 500 Pa to 60 kPa, from the viewpoint of uniform etching of a surface of the member to be etched 12. When the pressure of the etching gas in the chamber 10 is within the above range, a sufficient etching rate can be obtained, and an etching rate ratio with the non-etching target, i.e., the etching selectivity ratio is likely to be high.

The pressure in the chamber 10 before supplying the etching gas is not particularly limited as long as it is equal to or lower than the supply pressure of the etching gas or lower than the supply pressure of the etching gas. However, for example, the pressure in the chamber 10 is preferably from 1 Pa to less than 10 kPa, and more preferably from 10 Pa to 5 kPa.

A differential pressure between the supply pressure of the etching gas and the pressure in the chamber 10 before supplying the etching gas is preferably 1.0 MPa or less, more preferably 0.5 MPa or less, and still more preferably 0.3

MPa or less. When the differential pressure is within the above range, smooth supply of the etching gas to the chamber 10 is facilitated.

When supplying the etching gas to the chamber 10, it is preferable to supply the etching gas while maintaining the temperature of the etching gas at a predetermined value. Specifically, the supply temperature of the etching gas is preferably from 10° C. to 150° C.

The temperature of the member to be etched 12 during etching is from 140° C. to 300° C. When the temperature thereof is within the above temperature range, the etching of the etching target included in the member to be etched 12 proceeds smoothly, and the load on the etching device is small, which facilitates life extension of the etching device.

The processing time for etching (hereinafter may be referred to as "etching time") can be set optionally depending on how much the etching of the etching target included in the member to be etched 12 is desired. However, considering the production efficiency of semiconductor element manufacturing processes, the etching time is preferably within 30 minutes, more preferably within 20 minutes, and still more preferably within 10 minutes. Note that the processing time for etching refers to a time from when the etching gas is introduced into the chamber 10 to when the etching gas in the chamber 10 is exhausted in order to finish etching.

The dry etching method according to the present embodiment can be performed using a common plasmaless etching device used in the semiconductor element manufacturing processes, such as the etching device of FIG. 1, and the configuration of the etching device usable herein is not particularly limited.

For example, a positional relationship between the halogen fluoride gas supply pipe 5 and the member to be etched 12 is not particularly limited as long as the etching gas can be brought into contact with the member to be etched 12. It also suffices that the configuration of a temperature control mechanism of the chamber 10 allows the temperature of the member to be etched 12 to be controlled to any temperature. Accordingly, the temperature control mechanism may be directly provided on the stage 11, or the chamber 10 may be heated or cooled by an external temperature controller from outside the chamber 10.

In addition, the material of the etching device of FIG. 1 is not particularly limited as long as it has a corrosion resistance to a halogen fluoride to be used and allows depressurization to a predetermined pressure. For example, a portion of the etching device brought into contact with the etching gas can be made of a metal such as nickel, a nickel-based alloy, aluminum, stainless steel, or platinum, a ceramic such as alumina, a fluororesin, or the like. Specific examples of the nickel-based alloy include INCONEL (registered trademark), HASTELLOY (registered trademark), and MONEL (registered trademark). Additionally, examples of the fluororesin include polytetrafluoroethylene (PTFE), polychlorotrifluoroethylene (PCTFE), tetrafluoroethylene perfluoroalkoxyethylene copolymer (PFA), polyvinylidene fluoride (PVDF), TEFLON (registered trademark), VITON (registered trademark), and KALREZ (registered trademark).

EXAMPLES

A more detailed description of the present invention will be given by illustrating Examples and Comparative Examples below. Additionally, purities of bromine pentafluoride and iodine heptafluoride used in the following Examples and Comparative Examples were analyzed by a Fourier-transform infrared spectrophotometer Nicolet iS5 manufactured by Thermo Fisher Scientific Inc., a double beam spectrophotometer U-2900 manufactured by Hitachi High-Tech Science Corporation, and a gas chromatography GC-2014 manufactured by Shimadzu Corporation, and were all confirmed to be 99% by mass or more.

Example 1

Using an etching device having substantially the same configuration as that of the etching device of FIG. 1, etching (plasmaless etching) of a member to be etched was performed. A test piece (the member to be etched) used in Example 1 will be described with reference to FIG. 2.

Figure 2:
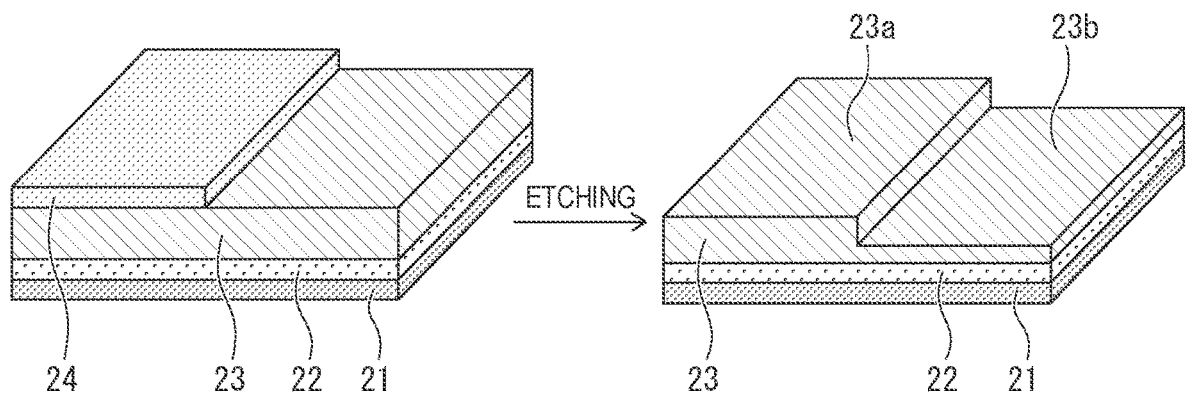

There was prepared a square silicon substrate 21 having a 2 inch side length formed with a titanium (Ti) film 22 having a film thickness of 100 nm thereon and then a copper film 23 having a film thickness of 600 nm on the titanium film 22 (manufactured by KST World Corporation). A rectangular silicon dioxide substrate 24 having a size of 1 inch×2 inch was glued onto the copper film 23 using grease (DEMNUM GREASE L-200 manufactured by Daikin Industries, Ltd.), and this laminate was used as the test piece. As illustrated in FIG. 2, the silicon dioxide substrate 24 was glued to cover approximately a half portion of the copper film 23.

The test piece was placed on a stage in a chamber of the etching device, and the temperature of the stage was raised to 160° C. Next, bromine pentafluoride gas at a flow rate of 50 mL/min and argon at a flow rate of 450 mL/min were mixed together to form a mixed gas, and the mixed gas was used as an etching gas. Then, the etching gas was supplied into the chamber at a flow rate of 500 mL/min and distributed for 10 minutes for etching. As a result, an exposed portion of the copper film 23 not covered by the silicon dioxide substrate 24 was etched. The pressure in the chamber during the distribution of the etching gas was 10 kPa, and the bromine pentafluoride gas had a partial pressure of 1 kPa. After completion of the distribution of the etching gas, the heating of the stage was stopped, and the atmosphere in the chamber was replaced with argon.

Additionally, the amount of oxygen gas contained in the etching gas was measured by the gas chromatography, and found to be less than 100 ppm by volume. Conditions for the measurement were as follows:

Measurement instrument: GC-2014 manufactured by Shimadzu Corporation
GC column: ShinCarbon ST 6m
Carrier gas: He (20 mL/min)
GC sample loop: 5 mL
Injection temperature: 150° C.
Column temperature: 50° C.
Detector: thermal conductivity detector (TCD)
Detection temperature: 200° C.
Electric current: 180 mA After the etching finished, the chamber was opened to take out the test piece. The silicon dioxide substrate 24 was removed from the test piece taken out, and the glued surface thereof was washed with ethanol to remove the grease. Then, using an atomic force microscope VN-8010 manufactured by Keyence Corporation, the size of a step difference between a covered surface 23a of the copper film 23 covered by the silicon dioxide substrate 24 and not etched and an etched surface 23b of the copper film 23 not covered by the silicon dioxide substrate 24 and etched was measured. The size (nm) of the measured step difference was divided by the etching time (min) to calculate the etching rate of copper (nm/min). Table 1 illustrates the result.

Note that conditions for measuring the size of the step difference using the atomic force microscope were as follows:
Measurement pressure: atmospheric pressure (101.3 kPa)
Measurement temperature: 28° C.
Measurement atmosphere: air atmosphere
Scanning range: 80.0 μm in width, 20.0 μm in height, 0° in angle.

same conditions as those of Example 1 to calculate the etching rates of copper and silicon oxide. Table 1 illustrates the results.

Example 12

Etching of the test piece was performed in the same manner as in Example 11 except that the silicon oxide film having the film thickness of 2000 nm in Example 11 was replaced by a photoresist cured product film having a film

TABLE 1

| | Etching target | Non-etching target | Stage temperature (° C.) | Etching gas Halogen fluoride | Inert gas | Other gas | Volume ratio[1] | Pressure (kPa) In-chamber | Halogen fluoride | Etching time (min) | Etching rate[2] (nm/min) |
|---|---|---|---|---|---|---|---|---|---|---|---|
| Ex. 1 | Copper | — | 160 | BrF$_5$ | Ar | — | 10/90/0 | 10 | 1 | 10 | 9 |
| Ex. 2 | Copper | — | 210 | BrF$_5$ | Ar | — | 10/90/0 | 10 | 1 | 10 | 23 |
| Ex. 3 | Copper | — | 280 | BrF$_5$ | Ar | — | 10/90/0 | 10 | 1 | 10 | 38 |
| Ex. 4 | Copper | — | 210 | BrF$_5$ | Ar | — | 20/80/0 | 10 | 2 | 10 | 56 |
| Ex. 5 | Copper | — | 210 | BrF$_5$ | Ar | — | 3/97/0 | 10 | 0.3 | 10 | 10 |
| Ex. 6 | Copper | — | 210 | BrF$_5$ | Ar | — | 10/90/0 | 1 | 0.1 | 10 | 10 |
| Ex. 7 | Copper | — | 210 | BrF$_5$ | Ar | — | 10/90/0 | 30 | 3 | 10 | 32 |
| Ex. 8 | Copper | — | 210 | BrF$_5$ | N$_2$ | — | 10/90/0 | 10 | 1 | 10 | 24 |
| Ex. 9 | Copper | — | 210 | BrF$_5$ | He | — | 10/90/0 | 10 | 1 | 10 | 24 |
| Ex. 10 | Copper | — | 210 | IF$_7$ | Ar | — | 10/90/0 | 10 | 1 | 10 | 25 |
| Ex. 11 | Copper | Silicon oxide | 210 | BrF$_5$ | Ar | — | 10/90/0 | 10 | 1 | 10 | 27/1 |
| Ex. 12 | Copper | Photoresist | 210 | BrF$_5$ | Ar | — | 10/90/0 | 10 | 1 | 10 | 27/2 |
| Ex. 13 | Copper | Amorphous carbon | 210 | BrF$_5$ | Ar | — | 10/90/0 | 10 | 1 | 10 | 27/2 |
| Ex. 14 | Copper(I) oxide | — | 280 | BrF$_5$ | Ar | — | 10/90/0 | 18 | 1 | 10 | 5 |
| Ex. 15 | Copper(II) oxide | — | 280 | BrF$_5$ | Ar | — | 10/90/8 | 10 | 1 | 10 | 2 |
| Ex. 16 | Copper nitride | — | 210 | BrF$_5$ | Ar | — | 10/90/8 | 10 | 1 | 10 | 17 |
| Ex. 17 | Copper | — | 210 | BrF$_5$ | Ar | O$_2$ | 10/89/1 | 10 | 1 | 10 | 9 |
| Comp. Ex. 1 | Copper | — | 130 | BrF$_5$ | Ar | — | 10/90/0 | 10 | 1 | 10 | Less than 0.1 |
| Comp. Ex. 2 | Copper | — | 210 | F$_2$ | Ar | — | 10/90/0 | 10 | 1 | 10 | Less than 0.1 |
| Comp. Ex. 3 | Copper | Silicon oxide/photoresist/ amorphous carbon | 30 | BrF$_5$ | Ar | — | 10/90/0 | $3 \times 10^{-3}$ | $3 \times 10^{-4}$ | 10 | 3/20/57/49 |
| Comp. Ex. 4 | Copper | Silicon oxide/photoresist/ amorphous carbon | 30 | IF$_7$ | Ar | — | 10/90/8 | $3 \times 10^{-3}$ | $3 \times 10^{-4}$ | 10 | 2/25/58/51 |

[1] A volume ratio of halogen fluoride gas to inert gas and other gas. For example, when halogen fluoride gas: inert gas:other gas = 10:90:0, it is described as 10/90/0.
[2] An etching rate of the etching target. When two or more numerical values are listed, they indicate the etching rates of the etching target and the non-etching target. For example, in Comparative Example 4, the etching rates of copper/silicon oxide/photoresist/amorphous carbon are listed in this order.

Examples 2 to 10

Etching of the test piece was performed in the same manner as in Example 1 except that the conditions were set as listed in Table 1 to calculate the etching rate of copper. Table 1 illustrates the results.

Example 11

There was prepared a square silicon substrate having a 2 inch side length formed with a silicon oxide film having a film thickness of 2000 nm thereon (manufactured by KST World Corporation). Then, a rectangular silicon dioxide substrate having a size of 1 inch×2 inch was glued onto the silicon oxide film using grease (DEMNUM GREASE L-200 manufactured by Daikin Industries, Ltd) so that approximately a half portion of the silicon oxide film was covered, and the resulting laminate was used as a test piece. Additionally, a test piece including the same copper film as that of Example 1 was prepared. Then, these two test pieces were placed on the stage in the chamber of the etching device, and the two test pieces were simultaneously etched under the thickness of 300 nm to calculate the etching rates of copper and a photoresist cured product. Table 1 illustrates the results. Note that the photoresist cured product film formed on the copper film 23 was formed by coating a photoresist TSCR (registered trademark) manufactured by Tokyo Ohka Kogyo Co., Ltd., on the copper film 23 and then exposing and curing it.

Example 13

Etching of the test piece was performed in the same manner as in Example 11 except that the silicon oxide film having the film thickness of 2000 nm in Example 11 was replaced by an amorphous carbon film having a film thickness of 500 nm to calculate the etching rates of copper and amorphous carbon. Table 1 illustrates the results.

Example 14

Etching of the test piece was performed in the same manner as in Example 1 except that a copper oxide film having a film thickness of 50 nm was formed instead of the copper film 23 on the titanium film 22 to calculate the etching rate of copper oxide. Table 1 illustrates the result. Note that the copper oxide in Example 14 was copper(I) oxide ($Cu_2O$).

Example 15

Etching of the test piece was performed in the same manner as in Example 1 except that a copper oxide film having a film thickness of 50 nm was formed instead of the copper film 23 on the titanium film 22 to calculate the etching rate of copper oxide. Table 1 illustrates the result. Note that the copper oxide in Example 15 was copper(II) oxide (CuO).

Example 16

Etching of the test piece was performed in the same manner as in Example 1 except that a copper nitride ($Cu_3N$) film having a film thickness of 100 nm was formed instead of the copper film 23 on the titanium film 22 to calculate the etching rate of copper nitride. Table 1 illustrates the result.

Example 17

Etching of the test piece was performed in the same manner as in Example 1 except that a mixed gas obtained by mixing bromine pentafluoride gas at a flow rate of 50 mL/min, argon at a flow rate of 445 mL/min, and oxygen gas at a flow rate of 5 mL/min was used as the etching gas to calculate the etching rate of copper. Table 1 illustrates the result.

Comparative Example 1

Etching of the test piece was performed in the same manner as in Example 1 except that the stage temperature was 130° C. to calculate the etching rate of copper. Table 1 illustrates the result.

Comparative Example 2

Etching of the test piece was performed in the same manner as in Example 1 except that fluorine gas ($F_2$ gas) was used instead of bromine pentafluoride gas and a mixed gas obtained by mixing fluorine gas at a flow rate of 50 mL/min and argon at a flow rate of 450 mL/min was used as the etching gas to calculate the etching rate of copper. Table 1 illustrates the result.

Comparative Example 3

Etching of the test piece was performed as in the same manner as in Example 1 except that normal plasma etching was performed by generating a plasma of etching gas in the chamber and etching in the chamber with the plasma of the etching gas and conditions for the etching were set as follows.

As test pieces, there were prepared a substrate formed with a copper film having a film thickness of 100 nm (manufactured by KST World Corporation), a substrate formed with a silicon oxide film having a film thickness of 2000 nm (manufactured by KST World Corporation), a substrate including a photoresist cured product film having a film thickness of 300 nm formed by coating a photoresist (TSCR (registered trademark) manufactured by Tokyo Ohka Kogyo Co., Ltd.) and exposing and curing it, and a substrate formed with an amorphous carbon film having a film thickness of 500 nm (manufactured by KST World Corporation). Then, these four types of test pieces were placed on the stage in the chamber of the etching device and etched simultaneously to measure the etching rates of the four types of films. Table 1 illustrates the results.

Conditions for the etching were set as follows. As the etching device, a parallel flat plate type plasma CVD device RIE-800 iPC was used at a source power of 500 W and a bias power of 100 W. The etching gas used was a mixed gas obtained by mixing bromine pentafluoride gas at a flow rate of 5 mL/min and argon at a flow rate of 45 mL/min. The etching time was seconds, the stage temperature was 30° C., and the in-chamber pressure was 3 Pa.

Comparative Example 4

Etching of the test pieces was performed in the same manner as in Comparative Example 4 except that the halogen fluoride was iodine heptafluoride and the etching gas used was a mixed gas obtained by mixing an iodine heptafluoride gas at a flow rate of 5 mL/min and argon at a flow rate of 45 mL/min to calculate the etching rates of the four types of films. Table 1 illustrates the result.

Example 21

Etching was performed in the same manner as in Example 1 except that the etching target was a copper(II) fluoride powder (manufactured by Kanto Chemical Co., Inc., mean particle size: 0.3 µm, purity: 99.5%). After completion of the distribution of the etching gas, the atmosphere in the chamber was replaced with argon, and the etching target was taken out to measure a mass of the etching target.

Then, the mass of the etching target reduced due to the etching was divided by a mass of the etching target before the etching to calculate a mass reduction ratio of the etching target. Table 2 illustrates the result.

Note that the mean particle size of powder such as the copper(II) fluoride powder was a mean particle size on a volume basis, and was measured using a laser diffraction/scattering particle size distribution analyzer PARTICA LA-960 manufactured by Horiba, Ltd.

TABLE 2

|  | Etching target | Stage temperature (° C.) | Etching gas | | | Pressure (kPa) | | Etching time (min) | Mass reduction ratio (%) |
|  |  |  | Halogen fluoride or fluorine gas | Inert gas | Volume ratio[1] | In-chamber | Halogen fluoride |  |  |
| Ex. 21 | Copper fluoride | 210 | $BrF_5$ | Ar | 10/90 | 10 | 1 | 10 | 53 |

TABLE 2-continued

| | | | Etching gas | | | Pressure (kPa) | | Etching | Mass reduction |
|---|---|---|---|---|---|---|---|---|---|
| | Etching target | Stage temperature (° C.) | Halogen fluoride or fluorine gas | Inert gas | Volume ratio[1] | In-chamber | Halogen fluoride | time (min) | ratio (%) |
| Ex. 22 | Copper fluoride | 210 | IF$_7$ | Ar | 10/90 | 10 | 1 | 10 | 61 |
| Comp. Ex. 11 | Copper fluoride | 210 | F$_2$ | Ar | 10/90 | 10 | 1 | 10 | Less than 1 |
| Ex. 23 | Copper bromide | 210 | BrF$_5$ | Ar | 10/90 | 10 | 1 | 10 | 92 |
| Ex. 24 | Copper bromide | 210 | IF$_7$ | Ar | 10/90 | 10 | 1 | 10 | 93 |
| Comp. Ex. 12 | Copper bromide | 210 | F$_2$ | Ar | 10/90 | 10 | 1 | 10 | Less than 1 |
| Ex. 25 | Copper iodide | 210 | BrF$_5$ | Ar | 10/90 | 10 | 1 | 10 | 93 |
| Ex. 26 | Copper iodide | 210 | IF$_7$ | Ar | 10/90 | 10 | 1 | 10 | 97 |
| Comp. Ex. 13 | Copper iodide | 210 | F$_2$ | Ar | 10/90 | 10 | 1 | 10 | 2 |

[1])A volume ratio of halogen fluoride or fluorine gas to inert gas. For example, halogen fluoride or fluorine gas: inert gas = 10:90, it is described as 10/90.

Example 22

Etching was performed in the same manner as in Example 21 except that the halogen fluoride was iodine heptafluoride and the etching gas used was a mixed gas obtained by mixing iodine heptafluoride gas at a flow rate of 50 mL/min and argon at a flow rate of 450 mL/min to calculate the mass reduction ratio of the etching target. Table 2 illustrates the result.

Comparative Example 11

Etching was performed in the same manner as in Example 21 except that fluorine gas was used instead of bromine pentafluoride gas and the etching gas used was a mixed gas obtained by mixing fluorine gas at a flow rate of 50 mL/min and argon at a flow rate of 450 mL/min to calculate the mass reduction ratio of the etching target. Table 2 illustrates the result.

Example 23

Etching was performed in the same manner as in Example 21 except that instead of the copper(II) fluoride powder, a copper(I) bromide powder (manufactured by Nacalai Tesque, Inc., mean particle size: 0.5 μm, purity: 97.5%) was used as the etching target to calculate the mass reduction ratio of the etching target. Table 2 illustrates the result.

Example 24

Etching was performed in the same manner as in Example 23 except that the halogen fluoride was iodine pentafluoride and the etching gas used was a mixed gas obtained by mixing iodine pentafluoride gas at a flow rate of 50 mL/min and argon at a flow rate of 450 mL/min to calculate the mass reduction ratio of the etching target. Table 2 illustrates the result.

Comparative Example 12

Etching was performed in the same manner as in Example 23 except that fluorine gas was used instead of bromine pentafluoride gas and a mixed gas obtained by mixing fluorine gas at a flow rate of 50 mL/min and argon at a flow rate of 450 mL/min was used as the etching gas to calculate the mass reduction ratio of the etching target. Table 2 illustrates the result.

Example 25

Etching was performed in the same manner as in Example 21 except that instead of the copper(II) fluoride powder, a copper(I) iodine powder (manufactured by Nacalai Tesque, Inc., mean particle size: 0.7 μm, purity: 99.5%) was used as the etching target to calculate the mass reduction ratio of the etching target. Table 2 illustrates the result.

Example 26

Etching was performed in the same manner as in Example 25 except that the halogen fluoride was iodine heptafluoride and the etching gas used was a mixed gas obtained by mixing iodine heptafluoride gas at a flow rate of 50 mL/min and argon at a flow rate of 450 mL/min to calculate the mass reduction ratio of the etching target. Table 2 illustrates the result.

Comparative Example 13

Etching was performed in the same manner as in Example 25 except that fluorine gas was used instead of bromine pentafluoride gas and a mixed gas obtained by mixing fluorine gas at a flow rate of 50 mL/min and argon at a flow rate of 450 mL/min was used as the etching gas to calculate the mass reduction ratio of the etching target. Table 2 illustrates the result.

The results of Examples 1, 2, and 3 show that the higher the stage temperature, the higher the copper etching rate.

The results of Examples 2, 4, and 5 show that the higher the halogen fluoride percentage in the etching gas, the higher the copper etching rate.

The results of Examples 2, 6, and 7 shows that the higher the in-chamber pressure, the higher the copper etching rate.

The reason for this seems to be that an increased partial pressure of the halogen fluoride gas in the chamber increased the frequency of contact between a copper surface and the halogen fluoride, which improved a copper conversion rate into an etching product (a reaction product produced as a result of copper etching).

The results of Examples 8 and 9 show that even with the use of nitrogen gas or helium as the inert gas, copper etching proceeds without problems.

The result of Example 10 shows that even with the use of iodine heptafluoride as the etching gas, copper etching proceeds without problems.

The results of Examples 11, 12, and 13 show that copper etching proceeds selectively under the conditions where copper and the non-etching target are present in the same chamber. These results indicate that using the dry etching method according to the present invention allows copper to be selectively etched compared to the non-etching target.

The results of Examples 14, 15, and 16 show that copper oxide and copper nitride can be etched. The results also show that the dry etching method according to the present invention can also be applied to removal of a natural oxide film or nitride film on the copper surface.

The result of Example 17 shows that when oxygen gas is contained in the etching gas, the copper etching rate is reduced slightly.

The result of Comparative Example 1 shows that when the stage temperature is outside the range of the present invention, copper etching is less likely to proceed.

The result of Comparative Example 2 shows that when fluorine gas is used as the etching gas, copper etching is less likely to proceed.

The results of Comparative Examples 3 and 4 show that in plasma etching, although copper etching proceeds, etching of the non-etching target also proceeds simultaneously.

The results of Examples 21 to 26 show that the dry etching method according to the present invention allows etching of copper halides (copper fluoride, copper bromide, and copper iodide) to proceed without problems.

On the other hand, the results of Comparative Examples 11, 12, and 13 show that when fluorine gas is used as the etching gas, copper halide etching is less likely to proceed.

REFERENCE SIGNS LIST

1: Halogen fluoride gas supply unit
2: Inert gas supply unit
3: Halogen fluoride gas flow rate control device
4: Inert gas flow rate control device
5: Halogen fluoride gas supply pipe
6: Inert gas supply pipe
7, 16: Pressure gauge
8: Inert gas pressure control device
10: Chamber
11: Stage
12: Member to be etched
13: Exhaust pipe
14: Thermometer
15: Vacuum pump
21: Silicon substrate
22: Titanium film
23: Copper film
24: Silicon dioxide substrate

The invention claimed is:

1. A dry etching method comprising a dry etching step in which an etching gas containing bromine pentafluoride is brought into contact with a member to be etched including an etching target being a target of etching with the etching gas to etch the etching target without using plasma,
wherein the etching target contains copper; and
wherein the dry etching step is performed under temperature conditions of from 140° C. to 300° C.

2. The dry etching method according to claim 1, wherein the etching gas is a gas comprising only a gas of bromine pentafluoride or is a mixed gas containing bromine pentafluoride and inert gas which is at least one selected from nitrogen gas, helium, argon, neon, krypton, and xenon.

3. The dry etching method according to claim 2, wherein an amount of the halogen fluoride contained in the etching gas is from 1% by volume to 90% by volume.

4. The dry etching method according to claim 1, wherein an amount of bromine pentafluoride contained in the etching gas is from 1% by volume to 90% by volume.

5. The dry etching method according to claim 1, wherein an amount of oxygen gas contained in the etching gas is 1% by volume or less.

6. The dry etching method according to claim 1, wherein the dry etching step is performed under pressure conditions of from 50 Pa to 80 kPa.

7. The dry etching method according to claim 1, wherein the etching target contains at least one of a copper compound containing at least one type of atom among oxygen, nitrogen, and halogen atoms and copper or elemental copper.

8. The dry etching method according to claim 1, wherein the dry etching step is performed under temperature conditions of from 210° C. to 280° C.

9. The dry etching method according to claim 1, wherein the member to be etched includes a non-etching target not being the target of the etching with the etching gas and the etching target, the etching target being selectively etched compared to the non-etching target.

10. The dry etching method according to claim 9, wherein the non-etching target is at least one selected from silicon oxide, photoresist, and amorphous carbon.

11. The dry etching method according to claim 9, wherein an etching selectivity ratio being a ratio of an etching rate of the etching target to an etching rate of the non-etching target is 5 or more.

12. A method for manufacturing a semiconductor element, the method using the dry etching method according to claim 1 to manufacture the semiconductor element,
wherein the member to be etched is a semiconductor substrate including the etching target; and
wherein the manufacturing method comprises a processing step of removing at least a part of the etching target from the semiconductor substrate by the dry etching method.

13. The method for manufacturing a semiconductor element according to claim 12, wherein copper wiring is formed on the semiconductor substrate by the processing step.

14. A cleaning method for cleaning an inner surface of a chamber of a semiconductor element manufacturing device using the dry etching method according to claim 1,
wherein the member to be etched is the chamber, the chamber having, on the inner surface, a deposit adhered due to operation of the semiconductor element manufacturing device, and the deposit being the etching target; and
wherein the cleaning method comprises a cleaning step of removing the deposit from the inner surface of the chamber by the dry etching method.

* * * * *